United States Patent
Nagai et al.

(10) Patent No.: US 6,259,094 B1
(45) Date of Patent: Jul. 10, 2001

(54) ELECTRON BEAM INSPECTION METHOD AND APPARATUS

(75) Inventors: Takamitsu Nagai, Machida; Yuichiro Yamazaki, Edogawa-Ku; Motosuke Miyoshi, Minato-Ku, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/191,116

(22) Filed: Nov. 13, 1998

(30) Foreign Application Priority Data

Nov. 14, 1997 (JP) .................................... 9-313205

(51) Int. Cl.[7] .......................... H01J 37/147; H01J 37/10; H01J 37/29
(52) U.S. Cl. .............................. 250/310; 250/397
(58) Field of Search ..................... 250/397, 310, 250/307

(56) References Cited

U.S. PATENT DOCUMENTS

| 4,954,705 | * | 9/1990 | Brunner et al. | 250/310 |
| 4,978,855 | * | 12/1990 | Liebl et al. | 250/310 |
| 5,498,874 | * | 3/1996 | Miyoshi | 250/397 |
| 5,576,833 | | 11/1996 | Miyoshi et al. | 356/394 |
| 5,969,356 | * | 10/1999 | Grzelakowski | 250/397 |
| 6,011,262 | * | 1/2000 | Hamashima et al. | 250/310 |
| 6,023,060 | * | 2/2000 | Chang et al. | 250/310 |

FOREIGN PATENT DOCUMENTS 4-242060    8/1992 (JP) .

OTHER PUBLICATIONS

K. Tsuno, Ultramicroscopy, vol. 55, pp. 127–140, "Simultation of a Wien Filter as Beam Separator in a Low Energy Electron Microscope", Apr. 11, 1994.

* cited by examiner

Primary Examiner—Bruce C. Anderson
(74) Attorney, Agent, or Firm—Oblon, Spivak, McClelland, Maier & Neustadt, P.C.

(57) ABSTRACT

An apparatus having an electron beam irradiation unit (11) for emitting an electron beam having a rectangular cross section from a linear cathode (12), and irradiating the inspection region (1a) of a sample (16) with the electron beam, a secondary optical system projection optical unit (17) for forming an image (defined by secondary and reflected electrons produced from the inspection region (1a) irradiated with the electron beam) onto an electron beam detection unit in a predetermined scale of enlargement, and an electron beam detection unit (22) for generating and outputting a detection signal in accordance with the formed image. The electron beam irradiation unit (11) forms the electron beam to have substantially the same area as the inspection region (1a) of the sample surface (16), and irradiates the inspection region (1a) with a single irradiation of the formed electron beam. In this way, the problems of conventional scanning electron microscopes, (i.e., low scanning velocity and image display speed, and the problems of direct mapping electron microscopes, i.e., difficulty in changing the beam shape in accordance with the inspection region while maintaining the current density), can be solved.

6 Claims, 7 Drawing Sheets

ELECTRON BEAM INSPECTION METHOD AND APPARATUS

BACKGROUND OF THE INVENTION

The present invention relates to an inspection method and apparatus using an electron beam and, more particularly, to an inspection method and apparatus suitable for inspection of a pattern formed on the surface of a semiconductor wafer.

Conventional scanning electron microscopes such as the one shown in FIG. 1 observe and inspect samples such as a semiconductor wafer or the like by irradiating an electron beam onto the sample surface. An electron beam is emitted by a cathode 35, is focused by a focusing lens 36 and objective lens 38, and is scanned over the surface of the grounded sample 39 by a scanning electrode 37.

A point light source is normally used for the cathode 35. In order to obtain a resolution that allows pattern observation, the electron beam emitted by the point light source is temporarily focused by, e.g., a focusing lens 36, and is focused again by an objective lens 38 to reduce the size of the spot. The scanning electrode 37 scans an electron beam over the surface of the sample 39. Secondary and reflected electrons are emitted from the surface of the sample 39, and are detected and converted into a detection signal by a detector 40. The detection signal is amplified by an amplifier 41, and is then supplied to an image processor 43. A sync. signal for synchronizing the detection signal with the scans of the electron beam is supplied from a scanning circuit 42 to the image processor 43. The luminance of the monitor 44 is determined by the amount of information indicated by the detection signal. This signal is synchronized by the sync. signal and output from the amplifier 41. In order to increase the S/N ratio of the image, the image signals for each frame output from the amplifier 41 are combined by the image processor 43, and the resultant image is displayed on the monitor 44.

An example of a conventional electron beam inspection apparatus is shown in FIG. 2. This apparatus was proposed by Japanese Patent Laid-Open No. 5-109381 and is balled a direct reflected electron microscope. A primary electron beam emitted by an electron gun 1 is focused by an irradiation lens system 6, and is then deflected by a first Wien filter 3 (that applies an electric field and a magnetic field to the electron beam), before hitting the surface of the sample 4 at perpendicular angle. Secondary and reflected electrons emitted from the sample 4 are accelerated by an emission lens 5. The electron beam is then projected onto the first screen 7 by the first projection lens system 2, thus allowing the operator to directly observe the projected image.

Energy analysis can also be made. To do this, the first screen 7 is removed from the optical axis and the second Wien filter 8 is set to only allow secondary and reflected electrons of a certain energy level to pass straight through. The secondary and reflected electrons that pass straight through the second Wien filter 8 are enlarged to a predetermined size by a second imaging lens system 9, and are displayed on the second screen 10.

Such conventional electron beam inspection apparatuses, however, suffer from the following problems. The scanning electron microscope shown in FIG. 1 uses a scanning electrode, scanning coil to allow the operator to observe a wide range of the sample surfaces while attaining suitable resolution. However, the speed of scanning is limited in this method since the linearity of scanning must be maintained. Furthermore, since the electron beam must be focused, the current amount decreases, resulting in a drop in the S/N ratio.

Conventionally, in order to solve such problem, images formed by secondary and reflected electrons are processed and stored in a memory, and are combined in single frame unit. However, in this method, the image display speed decreases.

Furthermore, upon deflecting the electron beam to scan a broader surface area, the electron beam shifts from the center of the lens optical axis, thereby producing lens aberrations, and resulting in poor resolution.

In the direct reflected electron microscope shown in FIG. 2, a primary electron beam is generated by a standard electron gun 1 and irradiation lens system 2. In this arrangement, however, the electron beam cannot cover a sample region larger than 200 $\mu m^2$ at once. When the magnification must be changed in order to inspect a new region, the size of the primary electron beam must also be changed. However, in a conventional electron microscope, the beam shape cannot be changed without decreasing the current density. Furthermore, secondary and reflected electrons passing through the emission lens 5 are affected by the aberrations and transmittance of the emission lens 5. Such influences, however, are not taken into consideration.

SUMMARY OF THE INVENTION

It is, therefore, an object of the present invention to provide an electron beam inspection method and apparatus, which can solve the problems of conventional scanning electron microscopes (i.e., low scanning speed and low image display speed), and can also solve the problems of conventional direct electron microscopes (i.e., the inability to change the beam shape in accordance with the inspection region).

According to the present invention, there is provided an electron beam inspection apparatus comprising an electron beam irradiation unit which emits an electron beam having a rectangular cross section from a linear cathode, and irradiats the inspection region of the sample with the electron beam; a projection optical unit which forms an image (formed of secondary and reflected electrons emitted from the inspection region irradiated by the electron beam) onto an electron beam detection unit at a certain magnification; and an electron beam detection unit which generates and outputs a detection signal in accordance with the image formed by the projection optical unit, wherein the electron beam formed by the election beam irradiation unit covers substantially the same area as the inspection region on the sample surface, and irradiates the entire inspection region at once with the formed electron beam.

In the present invention the ratio of the area irradiated by the electron beam to the inspection region should fall within the range of 0.9 to 2.0.

The electron beam irradiation unit may be located obliquely above the sample surface, or may have a rotation-asymmetric electrostatic lens.

The electron emitting surface of the linear cathode may be rectangular in shape and have an aspect ratio within the range of 10:1 to 50:1.

The projection optical unit may comprise a cathode lens for accelerating and focusing the secondary and reflected electrons produced from the inspection region; an aperture for determining a divergent angle of the secondary and reflected electrons accelerated and focused by the cathode lens; a field aperture for determining the field of view of the secondary and reflected electrons, the divergent angle of which is determined by the aperture; and a projection lens for forming an image (defined by the secondary and reflected electrons, the field of view of which is determined by the field aperture) on the electron beam detection unit at a predetermined magnification.

The cathode lens may comprise an electrostatic cathode lens, and may have metal mesh positioned near the sample, through which the secondary and reflected electrons produced from the inspection region pass.

The cathode lens may comprise an electrostatic cathode lens, and first and second electrodes, through which the secondary and reflected electrons produced from the inspection region pass, and may be connected via a high-resistance material having a resistance of not less than $10^6$ Ω.

The cathode lens may comprise a magnetic lens, and may have a metal mesh positioned near the sample, through which the secondary and reflected electrons produced from the inspection region pass.

An electron beam inspection method of the present invention comprises the steps of: emitting an electron beam having a rectangular cross section from a linear cathode included in the primary optical unit and irradiating the inspection region of a sample with the electron beam; forming an image (defined by secondary and reflected electrons emitted from the inspection region irradiated by the electron beam) on an electron beam detection unit at a predetermined magnification using a projection optical unit; and generating and outputting a detection signal from the electron beam detection unit in accordance with the image formed by the projection optical unit, wherein the electron beam formed by the primary optical unit covers substantially the same area as the inspection region on the sample surface, and irradiates the entire inspection region at once with the formed electron beam.

In the present invention, the electron beam may have a rectangular sectional shape with an aspect ratio within the range of 10:1 to 50:1, and may be emitted by the linear cathode, and may irradiate the sample surface from an obliquely upward position.

As described above, according to the electron beam inspection method and apparatus of the present invention, the electron beam does not have to scan the inspection region since it can cover the entire inspection region at once, and the sample can be inspected from low to high magnifications without having to combine images. Since the need for devices for synchronizing the image on the monitor with the scanning of the electron beam or for combining images can be eliminated, the apparatus arrangement can be simplified. When the primary optical unit consists of a rectangular cathode and electrostatic lens, a large-current electron beam with a rectangular section can be formed, and an image with a high S/N ratio can be obtained. When the metal mesh and a sleeve using a high-resistance material are used in the cathode lens, a broader region of the sample can be inspected by single irradiation operation, and the inspection time can be shortened, since a high-transmittance lens with low aberrations can be realized for inspections of regions under low magnification.

DESCRIPTION OF THE PREFERRED EMBODIMENTS

An embodiment of the present invention will be described hereinafter with reference to the accompanying drawings.

Figure 1:
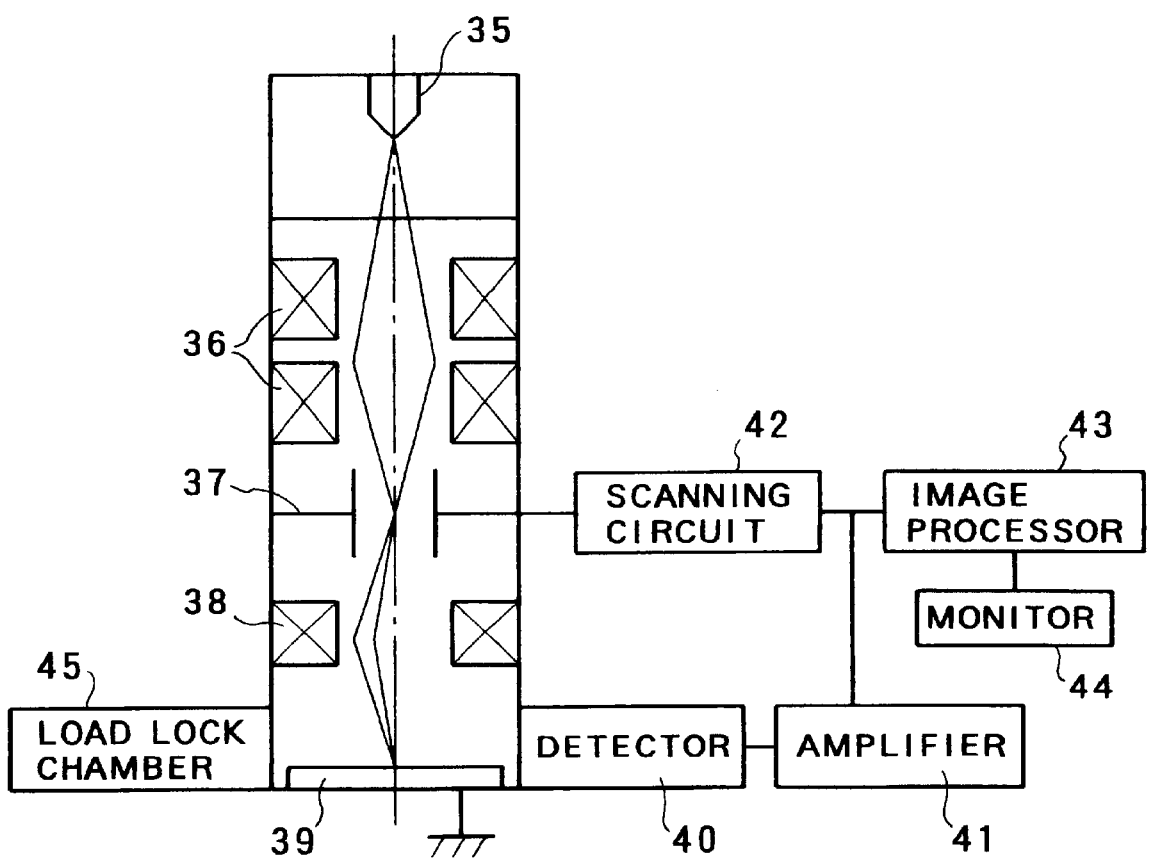
FIG. 1 is a sectional view showing the arrangement of a conventional scanning electron microscope.
Figure 2:
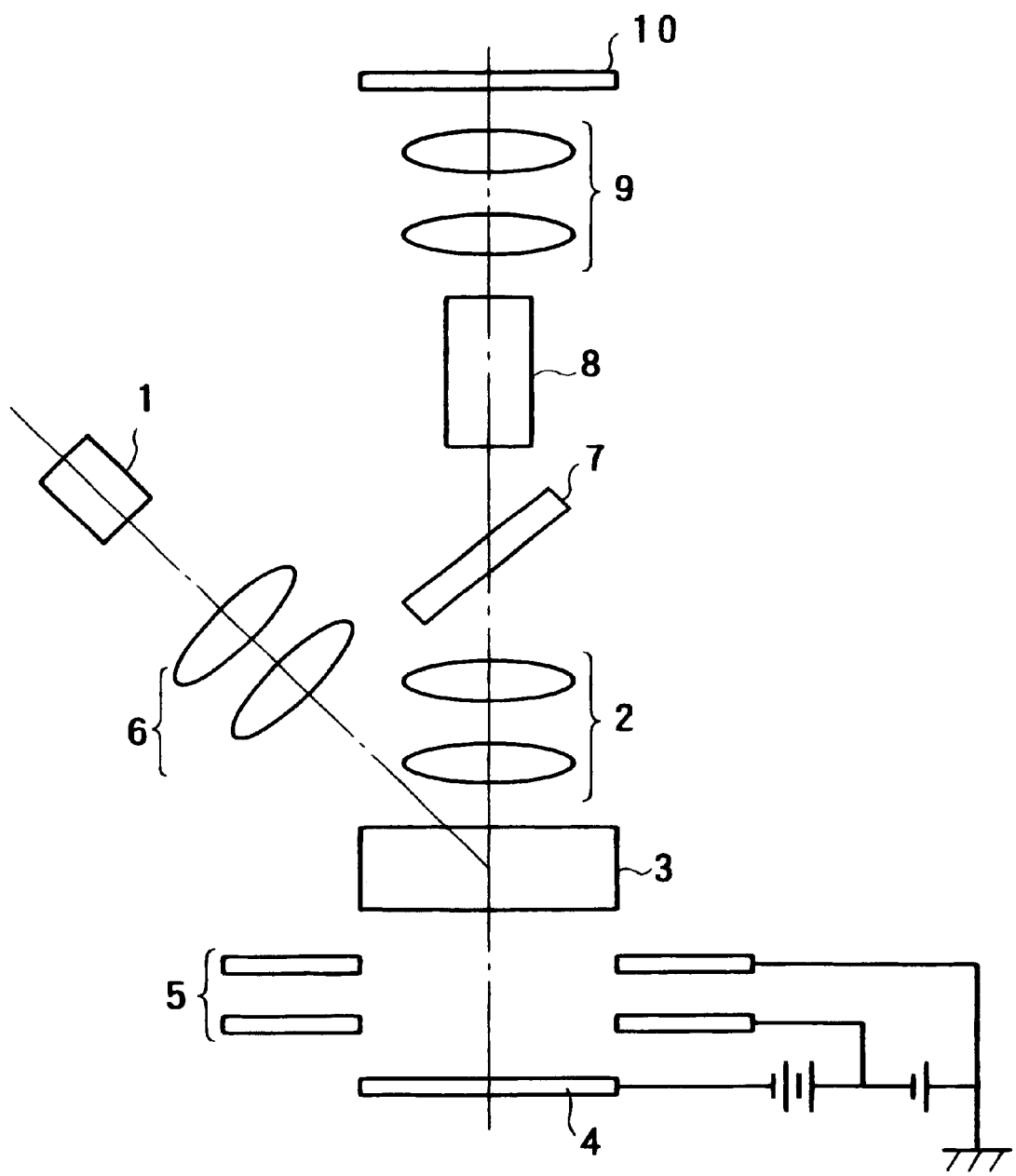
FIG. 2 is a sectional view showing the arrangement of a conventional direct reflected electron microscope.
Figure 3:
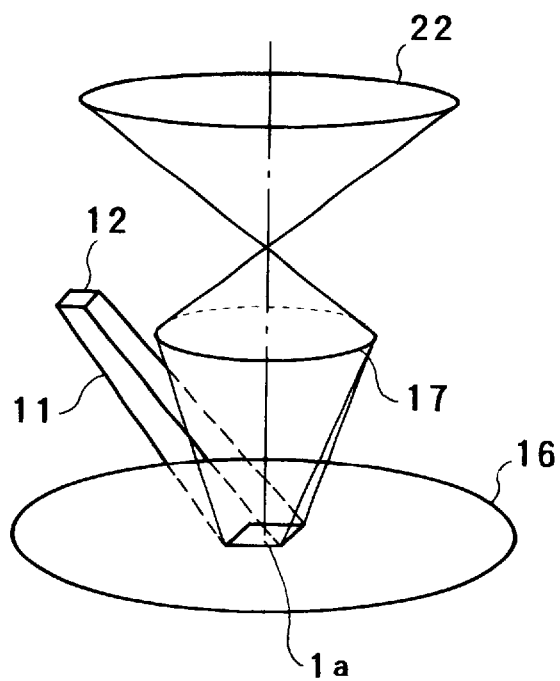
FIG. 3 is a perspective view of an electron beam inspection apparatus outlining how a sample surface is illuminated by a primary electron beam and the resultant secondary electron beam is projected into the electron detection system according to an embodiment of the present invention.

FIG. 3 shows the processes involved in an electron beam inspection method and apparatus according to an embodiment of the present invention from when the electron beam formed by the primary optical unit (to be referred to as the primary optical system hereinafter) 11 illuminates a sample 16 at once, until the secondary and reflected electrons produced from the sample 16 are projected onto the electron beam detection system 22 via a projection optical unit (to be referred to as a secondary optical system hereinafter) 17.

A primary electron beam emitted by a linear cathode 12, is shaped by the primary optical system 11 to a size nearly the same as that of an inspection region 1a of the sample 16 such as a semiconductor wafer, and then illuminates the inspection region 1a. The inspection region 1a irradiated with the electron beam emits secondary and reflected electrons over its entire surface. The produced secondary and reflected electrons are enlarged by the secondary optical system 17, and are projected directly onto the electron detection system 22.

As described above, this embodiment is characterized in that the electron beam simultaneously illuminates the inspection region 1a without having to scan, and two-dimensional information represented by the secondary and reflected electrons emitted over the entire region 1a are projected to the electron detection system 22 and subsequently displayed.

The inspection region 1a does not always have to match the irradiation region of the electron beam. For example, if the area of the inspection region is represented by the numeral 1, the area of the irradiation region only has to fall within the range of 1 to 2.0. This value is preferably set in accordance with the sample materials used.

When the sample consists of an insulating material or contains a large amount of insulating material, the ratio of the area to be irradiated should fall within the range of 1.0, as such samples become charged when irradiated by the electron beam and become damaged as a result. In order to eliminate such damage, the ratio of the irradiation area to the inspection region is preferably set to be relatively small. Samples with a large amount of insulating material also include sections of semiconductor wafers with a low density of aluminum or high-melting point metal wiring patterns.

In contrast to this, when a sample consists of a conductive material or contains a large amount of conductive material, the ratio of the area of the irradiation region to the inspection region 1a should fall within the range of 1 to 2. When an area larger than the region currently being inspected 1a is irradiated by the electron beam, the beam also covers the adjacent inspection regions before they are inspected, which increases the degree of irradiation by the electron beam. As a result, the amount of secondary and reflected electrons emitted is increased thus improving the S/N ratio. The above would apply when inspecting a region with a high wiring pattern density such as a semiconductor wafer containing a circuit pattern.

Figure 4:
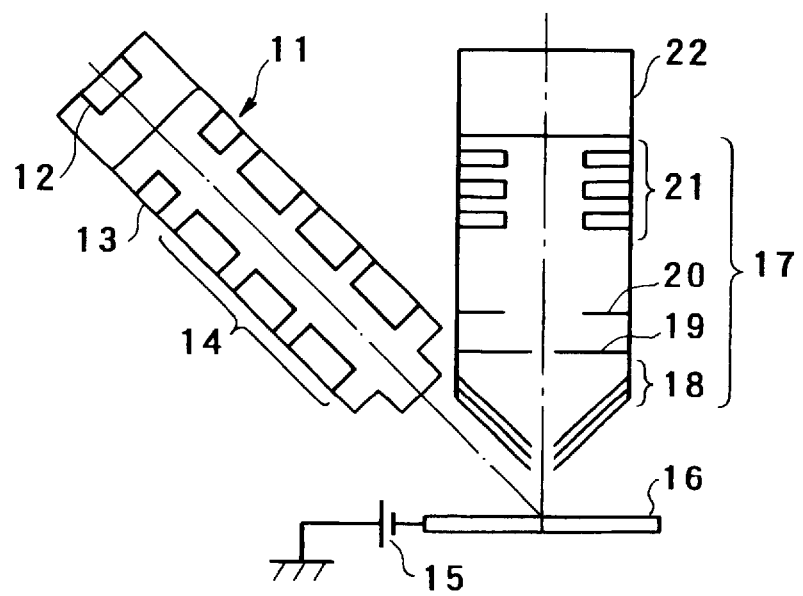
FIG. 4 is a sectional view showing the arrangement of the electron beam inspection apparatus according to the embodiment of the present invention.

FIG. 4 shows the arrangement of the electron beam inspection apparatus according to this embodiment. The primary optical unit 11 obliquely irradiates the sample 16 with an electron beam, and secondary and reflected electrons emitted from the sample 16 are projected in an magnification onto the electron detection system 22 via the secondary optical system 17.

In order to improve the S/N ratio, the current density of the electron beam that illuminates the inspection region 1a must be increased, and the primary optical system 11 must meet the following requirements. That is, in order to obtain a large current, a linear cathode 12 that can increase the area of an electron emission surface is preferably used. Furthermore, the reduction in electric field strength due to the increase in area of the electron emission surface can be suppressed by forming a linear cathode 12 having an high aspect ratio electron emission surface i.e., within the range of 10:1 to 50:1. The aspect ratio is the ratio of the length to width of the electron emission surface of the linear cathode 12.

With this technique, even when the strength of the electric field in the longitudinal direction is reduced a high electric field intensity can be maintained in the widthwise direction. Thus, the emission area can be increased while preventing an overall reduction in the strength of the electric field.

The cross section of the electron beam emitted by the linear cathode 12 is formed into a rectangular shape by an extractor lens 13 with three electrostatic electrodes. The rectangular electron beam is formed into an image by triple quadrupole lenses 14. The triple quadrupole lenses (triplets) 14 are asymmetric lenses, have a lens aberration correction effect, and have lower aberration than rotary-symmetric lenses.

Since the extractor lens 13 and the triple quadrupole lenses 14 can be configured as electrostatic lenses, size reduction can be attained more easily than when they are configured as magnetic lenses, and lower aberration can be realized. Since low aberration allows the beam divergent angle on the sample surface to be large, the beam current can be consequently increased to obtain a high current density.

If the longitudinal direction of the electron beam is defined as an X-axis, and the widthwise direction of the electron beam is defined as a Y-axis, the magnifications on the X- and Y-axes can be independently set. For this reason, the aspect of the rectangular section of the electron beam on the surface of the sample 16 can be set freely. For example, if a 1,200-$\mu$m$^2$ inspection region 1a is to be irradiated with the electron beam, when the linear cathode 12 has a size of 600×30 $\mu$m, the magnifications in the X- and Y-directions need only be respectively set at 2× and 40×. In this way, the desired area of the inspection region 1a can be irradiated with the electron beam without having to change the size of the linear cathode 12, as the magnifications in the X- and Y-directions can be set independently. As described above, according to this embodiment, a rectangular electron beam with a high current density and able to fully cover the inspection region with a single irradiation, can be formed.

Figure 5:
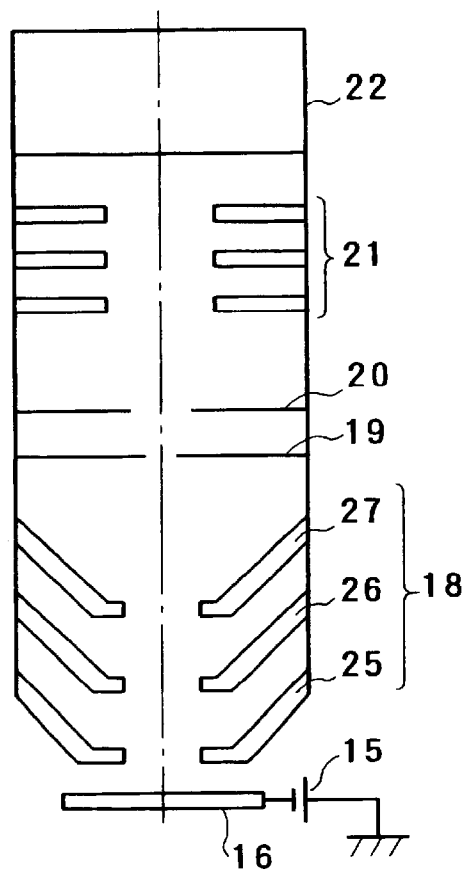
FIG. 5 is a sectional view showing the arrangement of a secondary optical system in the electron beam inspection apparatus according to an embodiment of the present invention.

The secondary optical system 17 projects a two-dimensional image onto the electron detection system 22. The image is formed by the secondary and reflected electrons emitted from the surface of the sample 16. When irradiated by the primary optical system 11. FIG. 5 shows the sectional structure of the secondary optical system 17 in detail. The secondary optical system 17 comprises a cathode lens 18, a stop 19, a field aperture 20, projection lenses 21, an electron detection system 22, and a power supply 15 for applying a negative voltage to the sample 16. The inspection region 1a of the sample 16 is irradiated with the electron beam. The beam has a high current density and is generated by the primary optical system 11. The secondary and reflected electrons emitted from the sample 16 form a two-dimensional electron image as a result of irradiation to the beam. The secondary and reflected electrons are accelerated by the negative voltage applied to the sample 16, and are enlarged to a desired magnification by the cathode lens 18.

The enlarged electron image is focused by the aperture 19, and is formed into an image by the field aperture 20. The aperture 19 is used for determining the divergent angle, and the field aperture 20 is used for improving the S/N ratio of the electron image, by limits the field of view and prevents excess scattered electrons. The electron image passes through the field aperture 20, is enlarged to a predetermined magnification by the projection lens 21, and is then projected onto the electron detection system 22.

According to this embodiment, image information of the inspection region 1a of the sample 16, is irradiated in a single irradiation by the primary optical system 11 and is simultaneously projected onto the electron detection system 22.

In the secondary optical system 22, the two-dimensional electron image must be projected in a magnification, as described above. When this is done, lens distortion is produced since electrons pass along trajectories other than the paraxial trajectories of the lens. In order to suppress such distortion, the lens inner diameter is preferably configured to be around 10 times the maximum value of the trajectories of electrons in the lens radial direction. When the lens is configured as such, the electron trajectories can be deemed as paraxial trajectories, and aberrations can be reduced.

Figure 6:
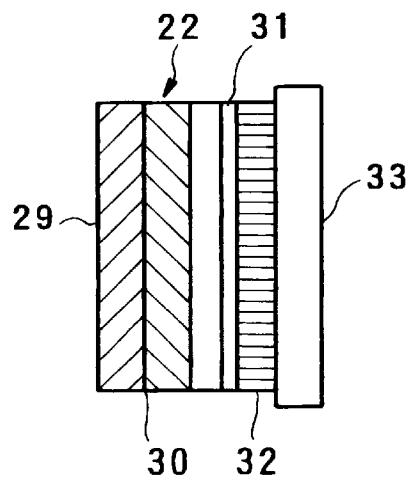
FIG. 6 is a sectional view showing the arrangement of the electron detection system in the electron beam inspection apparatus according to the embodiment of the present invention.

FIG. 6 shows the structure of the electron detection system 22 in detail. Secondary and reflected electrons emitted from the inspection region 1a of the sample 16 are formed into an image on the input surface of, e.g., a micro channel plate (to be referred to as an MCP hereinafter) 30 of the electron detection system 22 to form a two-dimensional electron image 29. The electron image 29 is converted into an optical signal after hitting a scintillation plate 31. The optical signal is changed into a certain scale after passing through a fiber optical plate 32, hits on the area image sensor 23, and is converted into a video signal by an area image sensor 33.

In this fashion, a two-dimensional electron image (formed by secondary and reflected electrons produced by the electron beam emitted by the primary optical system 11) is converted into a video signal, and is displayed on a monitor, thus allowing inspection of the surface of the sample 16. Thus, an image with a high S/N ratio can be generated and inspected without having to combine images as in the prior art.

Since a two-dimensional electron image of the inspection region 1a of the sample 16 irradiated with an electron beam can be obtained with a single irradiation of the beam, the image of the inspection region 1a can be projected and inspected in an enlarged scale without having to scan the electron beam, thus shortening the inspection time.

Figure 7:
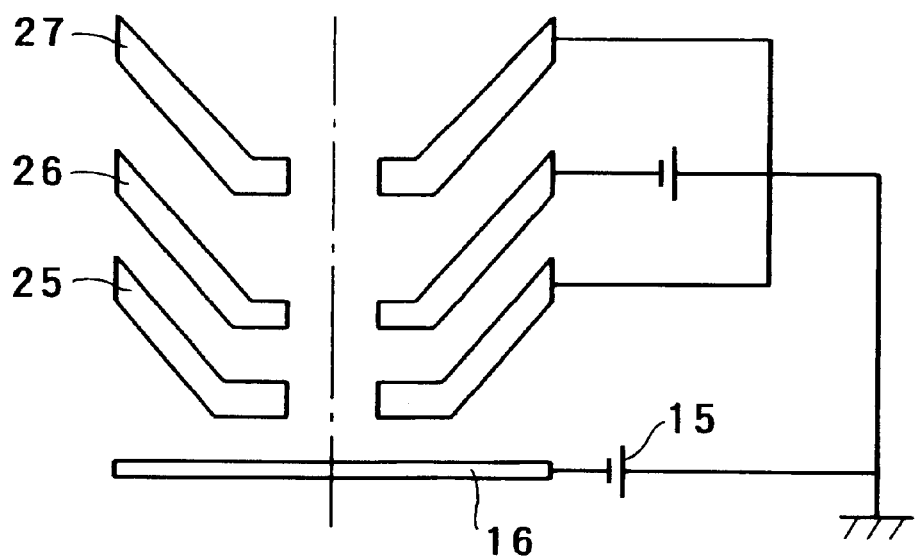
FIG. 7 is a sectional view showing the arrangement of the electrostatic cathode lens in the electron beam inspection apparatus according to the embodiment of the present invention.

In the secondary optical system 17, the cathode lens 18 has the largest influence on lens performance. The electron image accelerated from the sample 16 passes through this first. FIG. 7 shows the structure of the cathode lens 18 in detail. The cathode lens 18 comprises a power supply 15 for applying a negative voltage to the sample 16, and first, second, and third electrodes 25, 26, and 27. The secondary and reflected electrons emitted from the sample 16 are accelerated by an electric field between the sample 16 (which receives a negative voltage from the power supply 15), and the first electrode 25 of the cathode lens 18 connected to the ground potential. The accelerated secondary and reflected electrons pass through the cathode lens 18, are focused at the position of the aperture 19 due to the electrostatic lens effect, and are formed into an image by the field aperture 20. The cathode lens 18 allows the secondary and reflected electrons to be captured directly with low distortion before being formed into an image by the field aperture 20.

When inspecting a large area such as the surface of a semiconductor wafer, the inspection area to be irradiated with a single irradiation of the electron beam must be set as large as possible, e.g., 200 $\mu m^2$. This is done in order to shorten inspection time. As described above, in this embodiment, the triple quadrupole lenses of the primary optical system 11 allow the primary beam to have a rectangular cross section able to cover a large inspection region in a single irradiation.

The secondary optical system 17 is also required to capture an image of secondary and reflected electrons emitted from inspection regions as large as, 200 $\mu m^2$ with low aberration and without any reduction in transmittance. The cathode lens 18 suitable for projecting such large inspection regions in an enlarged scale will be explained below.

In this embodiment, an electron image (of secondary and reflected electrons produced upon irradiating a large inspection region with an electron beam) is projected in an enlarged scale. At this case, the magnification is low. At such low magnification, the secondary and reflected electrons produced from the broad inspection region must be accelerated without generating aberration, and captured by the cathode lens 18. When the inner diameter of the first lens 25 of the cathode lens is set to be large, off-axis aberrations can be suppressed without decreasing transmittance. In order to suppress aberrations in the cathode lens, the rate of change in potential distribution on the optical axis must be evened out. This is because aberrations that largely influence the lens performance, especially, spherical aberration Csi and chromatic aberration Cci, are defined, as described in Article 1:

$$Csi = -[1/H'i \sqrt[4]{\Phi+W})] \int_0^{Zi} H^4 Fr(H'/H) dz \quad (1)$$

For $$Fr(H'/H)/\sqrt{\Phi+W} = -\Phi'/(2(\Phi+W))(H'/H)^3 - D(H'/H)^2 + \quad (2)$$
$$D'(H'/H)/2 + [\Phi^{(4)}/(32(\Phi+W)) + eBB''/$$
$$(16 m(\Phi+W)) - D^2]$$

$$Cci = -(\sqrt{\Phi+W}/H' i^2) \int_0^{Zi} H^2 Ft (H'/H) dz \quad (3)$$

For $$Ft(H'/H)/\sqrt{\Phi+W} = 1/(\Phi+W)[\Phi'/(2(\Phi+W))H'/H + D]$$
$$D = \Phi''/4(\Phi+W)) + eB^2/8m (\Phi+W)$$

Article 1: A. Takaoka, K. Ura, T. Tomita and Y. Harada, "Improvement of Beam Characteristics by Superimposing a Magnetic Field Emission Gun", J. Electron-Microsc., Vol. 38, NO. 2, 83–94, 1989 where Z is the position of the trajectry, H is the lens radial direction, $\Phi$ is the potential, B is the magnetic field, W is the initial energy, and suffix I is a value at the image plane position.

As defined by equations (1) and (2) above in the case of an electrostatic lens, the magnetic field for spherical aberration and chromatic aberration is zero. Hence, the spherical aberration and chromatic aberration are defined by the potential $\Phi$, and the integrating factor of the first to fourth derivatives of the potential $\Phi$. For this reason, a small change in potential $\Phi$ leads to a decrease in sum total of the differential values, i.e., a decrease in aberration.

Figure 8:
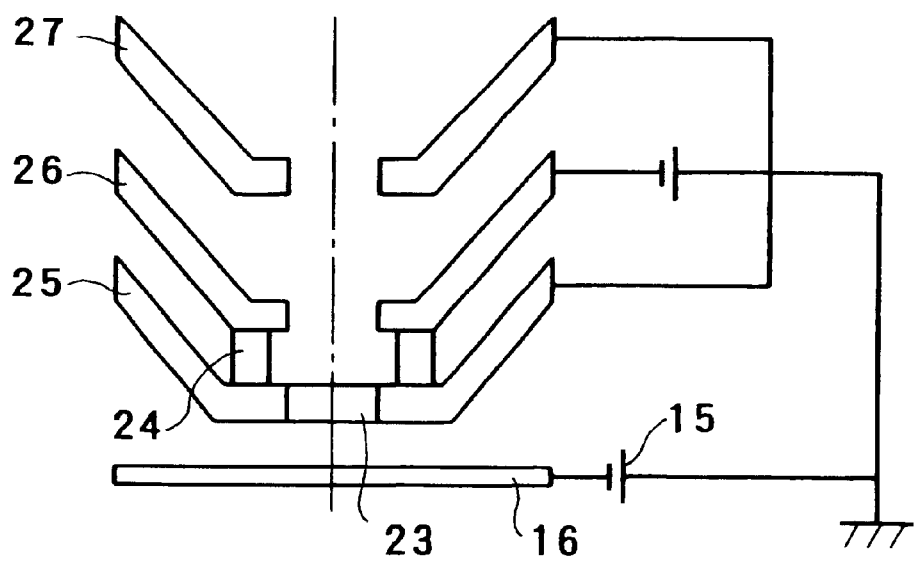
FIG. 8 is a sectional view showing another arrangement of an electrostatic cathode lens in the electron beam inspection apparatus according to the embodiment of the present invention.

FIG. 8 shows a cathode lens according to this embodiment. This cathode lens comprises a first electrode 25, a metal mesh 23, a sleeve 24 (which has a surface coat consisting of a high-resistance material such as silicon carbide (SiC) or is entirely made of a high-resistance material), a second electrode 26, and a third electrode 27.

Note that the voltages to be applied to the second electrodes 26 is −5 to −1 kV. The coat of the sleeve 24 preferably has a resistance around $10^6$ Ω. However, the present invention is not limited to SiC, and any other material may be used as long as it has a higher resistance than SiC. As described above, this embodiment must satisfy a condition of low-magnification inspection. Thus, the inner diameter of the first electrode 25 must be increased as much as possible to suppress off-axis aberration and to increase transmittance.

However, when the inner diameter of the first electrode 25 is increased, a leak in potential between the surface of the sample 16 and first electrode 25 occurs, and the potential quickly changes to make the electric field nonuniform, thus producing aberration. In order to reduce this phenomenon, metal mesh 23 is fitted to the inner diameter portion of the first electrode 25.

When the mesh 23 is attached to the first electrode 25, the potential quickly changes to zero potential in the first electrode 25, and aberration is produced. In order to prevent this phenomenon, the first and second electrodes 25 and 26, which are normally insulated from each other, are connected by the aforementioned sleeve 24 with a high-resistance coat, so as to make the potential between the electrodes 25 and 26 change smoothly.

Figure 9:
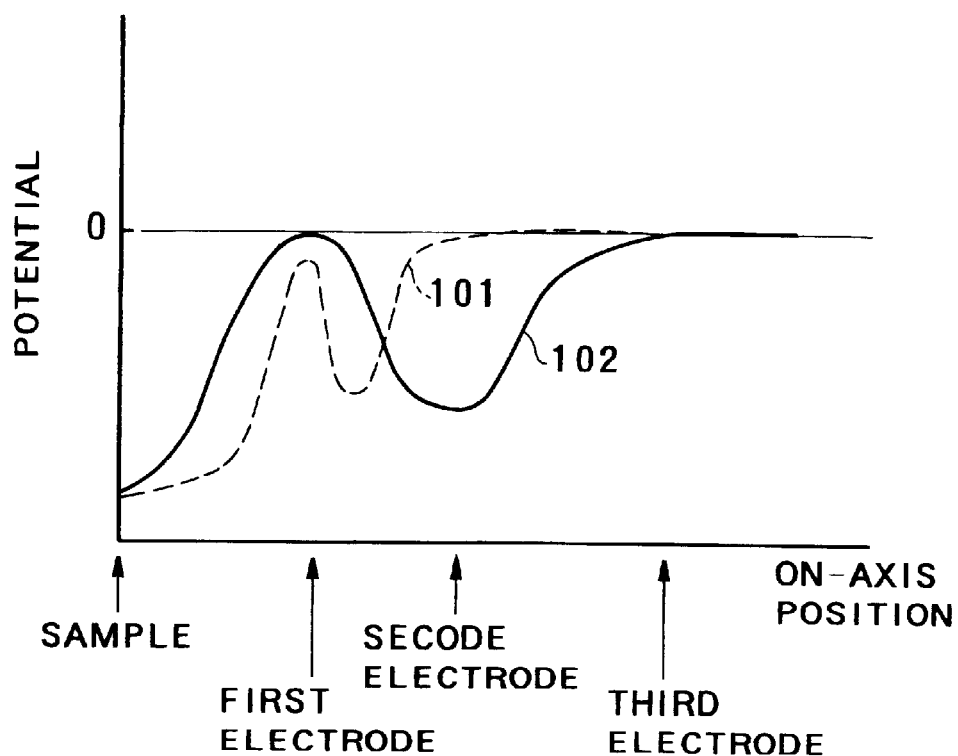
FIG. 9 is a potential graph showing changes in potential near the cathode lens in a conventional electron beam inspection apparatus, and that according to the embodiment of the present invention.

With this sleeve 24, the potential between the first and second electrodes 25 and 26 gradually increases from zero potential. In FIG. 9, changes in axis potential of a conventional electrostatic lens are indicated by the dotted curve 101, and changes in axis potential of the cathode lens in this embodiment is indicated by the solid curve 102. The x-axis in FIG. 9 plots the distance on the central axis from the sample to the cathode lens, and the ordinate plots the on-axis potential. Furthermore, the positions of the first, second, and third electrodes 25, 26, and 27 are plotted along the x-axis.

As can be seen from a comparison between the solid curve 102 and dotted curve 101, according to this embodiment, the potential changes smoothly from the sample to the third electrode 27, and aberrations of the cathode lens can be reduced.

Figure 10:
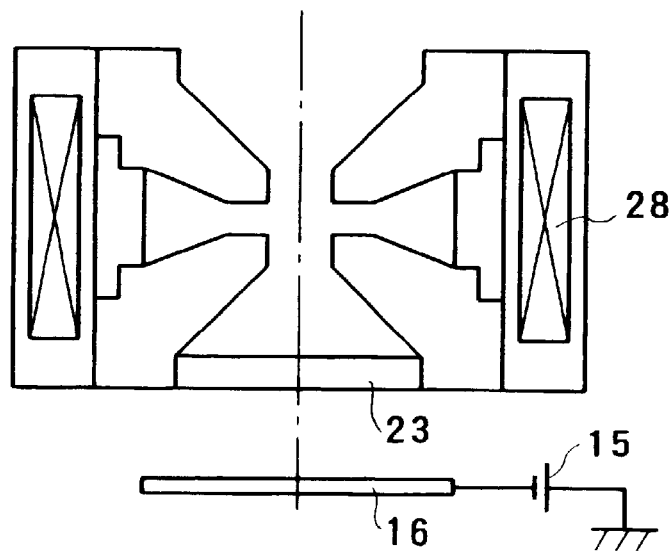
FIG. 10 is a sectional view showing the arrangement of a magnetic cathode lens in an electron beam inspection apparatus according to the embodiment of the present invention.

FIG. 10 shows a cathode lens using a magnetic lens having a magnetic coil 28 instead of the electrostatic cathode lens of the above embodiment. In this cathode lens, the metal mesh 23 is fitted in the hole of the magnetic pole on the side of the sample 16 so as to unify the potential between the sample and the magnetic pole on the side of the sample of the magnetic lens. Since the cathode lens formed by the magnetic lens also has metal mesh 23, the electric field between the sample and metal mesh 23 remains undisturbed, and is prevented from entering the lens. Thus, the distribution of the electric field between the sample and metal mesh 23 is unified, the interior of the lens remains unaffected by the electric field, and the required lens effect can be realized by forming a magnetic field, thereby suppressing aberrations.

The metal mesh 23 prevents the electric field from leaking from the aperture of the magnetic pole. Even when the metal mesh 23 is used, the metal mesh 23 does not influence the magnetic field in the cathode lens, as the lens does not operate as an electric field lens. For this reason, the metal mesh 23 does not produce any lens aberrations. As a result, the electron beam is accelerated with low aberration in a uniform electric field, then enters the magnetic lens, and is brought into focus at the position of the stop 19 by the magnetic field formed in the lens.

When this electromagnetic cathode lens is used, an electron image formed by the field aperture 20 is projected at a predetermined scale of enlargement by the projection lens 21.

Figure 11:
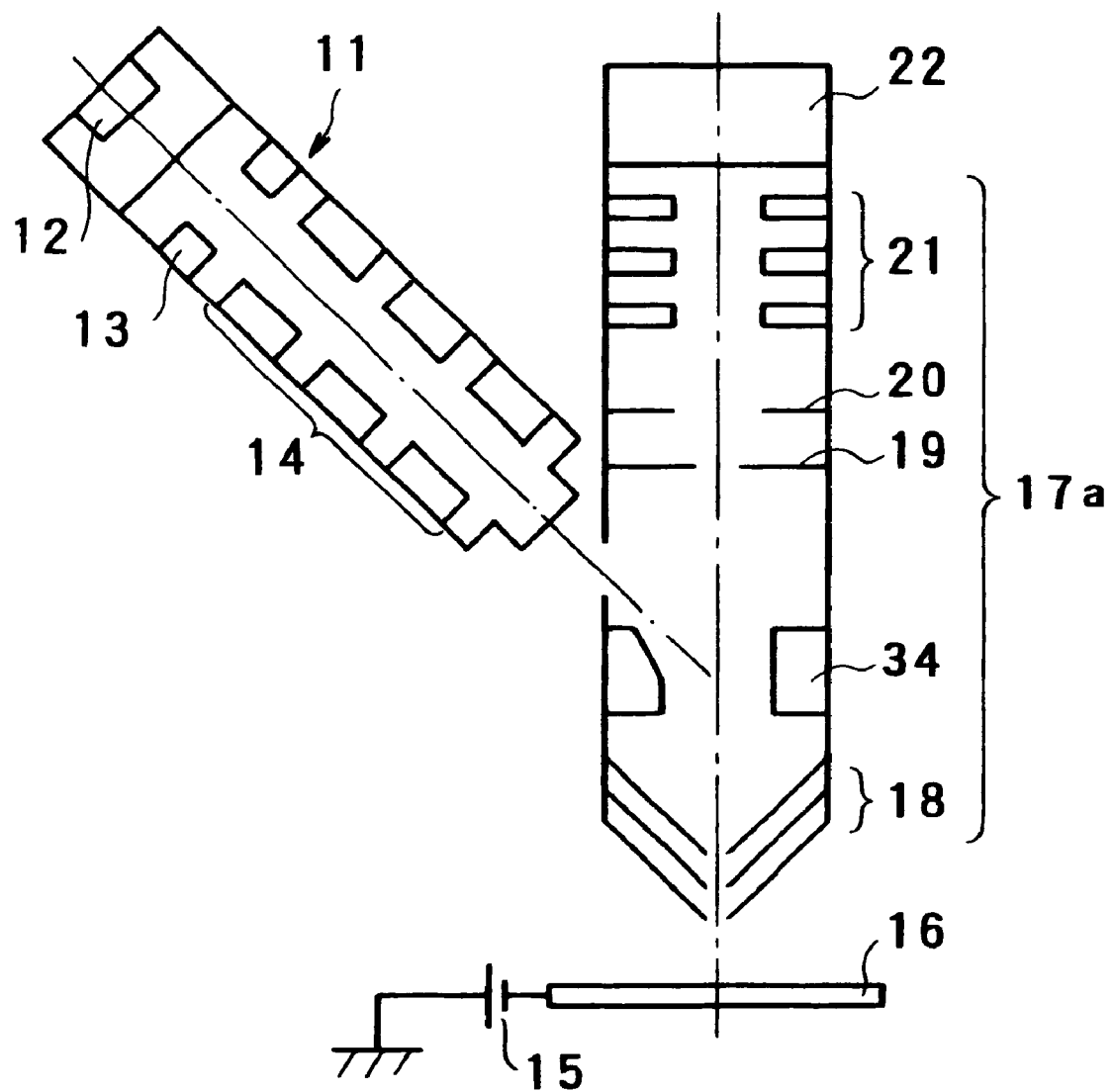
FIG. 11 is a sectional view showing the arrangement of an electron beam inspection apparatus including a Wien filter according to another embodiment of the present invention.

An electron beam inspection apparatus according to another embodiment of the present invention will be explained below with reference to FIG. 11. As shown in FIG. 11, this apparatus includes a Wien filter 34 for perpendicularly irradiating the sample 16 with a primary electron beam. The electron beam is emitted by the linear cathode 12 via the extractor lens 13. The beam is then shaped into beam having a rectangular cross section of the desired size by the triple quadrupole lenses 14. This is done without decreasing the current density. The beam then enters the Wien filter 34. The electron beam is deflected by the Wien filter 34, and passes through the cathode lens 18 to fall perpendicularly incident on the surface of the sample 16. Secondary and reflected electrons emitted from the sample 16 pass in a direction opposite to that of the primary electron beam. Thus, a secondary electron beam formed by the secondary and reflected electrons pass straight along the optical axis of the secondary optical system 17a without being deflected, since the Wien condition is satisfied and the electro-magnetic field forces are balanced.

The primary and secondary electron beams pass through the cathode lens 18 in opposite directions. If the size of the primary beam is enlarged to $a\times$ after it leaves the cathode lens 18, and if the size of the secondary beam is enlarged to $b\times$ after it leaves the cathode lens, we have:

$$a \times b = 1 \qquad (4)$$

Thus, the entire optical system including the cathode lens 18 must be taken into account when determining the size of the primary electron beam. For example, when the primary beam has a size of 100 $\mu m^2$ before entering the cathode lens 18, and the cathode lens is set at a magnification of ½× with respect to the primary beam, a primary beam having a size of 50 $\mu m^2$ falls incident on the surface of the sample 16. A secondary beam having the same size as that of the primary beam is produced by the region 1a irradiated with the beam having a size of 50 $\mu m^2$, and is enlarged to 2× via the cathode lens 18 in a direction opposite to the primary beam, thus obtaining a secondary beam having a size of 100 $\mu m^2$.

Since the region is irradiated with a single irradiation of the primary beam, the size of the secondary beam increases. Thus, aberrations are produced since the secondary beam falls outside the paraxial trajectories of the Wien filter 34. As a result, the lens must be designed so that the maximum trajectry of the primary and secondary beams in the lens radial direction falls within the paraxial range, i.e., within 20 to 30% of the lens inner diameter. The inner diameter of the Wien filter 34, for example, is preferably designed to be about 10 times the maximum value of the trajectories of the primary and secondary beams. In this embodiment, the distance between the sample 16 and cathode lens 18 can be shortened since the primary beam between the sample 16 and cathode lens 18 does not have to be obliquely incident. As a consequence, aberrations of the cathode lens 18 can be reduced.

The aforementioned embodiments are merely examples and do not limit the scope of the present invention. Although, the primary optical system 11 uses triple quadrupole lenses 14 in the above embodiment. If could, for example, use double quadrupole lenses (doublet) or multipole lenses such as octapole lenses. In the above embodiment, the projection lens 21 comprises an electrostatic Einzel lens which are more compact than magnetic field lenses. However, the projection lens 21 is not limited to a Einzel lens, but may comprise an asymmetric electrostatic lens, as proposed in the following Article 2:

Article 2: J. Orloff and L. W. Swanson, "An asymmetric electrostatic lens for field-emission microprobe applications", J. Appl. Phys. 50(4), April 1979

What is claimed is:

1. An electron beam inspection apparatus comprising:
   a) an electron beam irradiation unit configured to emit, from a linear cathode, an electron beam having a rectangular cross section, and to irradiate an inspection region of a sample with a single irradiation of the electron beam, wherein said electron beam irradiation unit forms the electron beam to have an area that is 0.9 to 2.0 times as large as the inspection region;
   b) a projection optical unit configured to form, at a predetermined scale of enlargement, an image that is defined by secondary and reflected electrons emitted from the inspection region when irradiated with the electron beam, said projection optical unit including:
   1) an electrostatic cathode lens configured to accelerate and focus the secondary and reflected electrons emitted from the inspection region, and including:
      i) a metal mesh, positioned near the sample, through which mesh the secondary and reflected electrons produced from the inspection region pass, 2) an aperture configured to determine a divergent angle of the secondary and reflected electrons accelerated and focused by said cathode lens,
3) a field aperture configured to determine a field of view of the secondary and reflected electrons whose divergent angle is determined by said aperture, and
4) a projection lens configured to form, at a predetermined scale of enlargement, the image defined by the secondary and reflected electrons whose field of view is determined by said field aperture; and c) an electron beam detection unit, on which the image is formed by said projection optical unit, configured to generate and to output a detection signal in accordance with the image.

2. An electron beam inspection apparatus comprising:

a) an electron beam irradiation unit configured to emit, from a linear cathode, an electron beam having a rectangular cross section, and to irradiate an inspection region of a sample with a single irradiation of the electron beam, wherein said electron beam irradiation unit forms the electron beam to have an area that is 0.9 to 2.0 times as large as the inspection region;

b) a projection optical unit configured to form, at a predetermined scale of enlargement, an image that is defined by secondary and reflected electrons emitted from the inspection region when irradiated with the electron beam, said projection optical unit including:
1) an electrostatic cathode lens, configured to accelerate and focus the secondary and reflected electrons emitted from the inspection region, and including:
   i) first and second electrodes, connected to each other via a high-resistance material having a resistance of not less than $10^6$ Ω, through which first and second electrodes the secondary and reflected electrons produced from the inspection region pass,
2) an aperture configured to determine a divergent angle of the secondary and reflected electrons accelerated and focused by said cathode lens,
3) a field aperture configured to determine a field of view of the secondary and reflected electrons whose divergent angle is determined by said aperture, and
4) a projection lens configured to form, at a predetermined scale of enlargement, the image defined by the secondary and reflected electrons whose field of view is determined by said field aperture; and c) an electron beam detection unit, on which the image is formed by said projection optical unit, configured to generate and to output a detection signal in accordance with the image.

3. An electron beam inspection apparatus comprising:

a) an electron beam irradiation unit configured to emit, from a linear cathode, an electron beam having a rectangular cross section, and to irradiate an inspection region of a sample with a single irradiation of the electron beam, wherein said electron beam irradiation unit forms the electron beam to have an area that is 0.9 to 2.0 times as large as the inspection region;

b) a projection optical unit configured to form, at a predetermined scale of enlargement, an image that is defined by secondary and reflected electrons emitted from the inspection region when irradiated with the electron beam, said projection optical unit including:
1) an magnetic lens, configured to accelerate and focus the secondary and reflected electrons emitted from the inspection region, and including:
   i) a metal mesh, positioned near the sample, through which mesh the secondary and reflected electrons produced from the inspection region pass,
2) an aperture configured to determine a divergent angle of the secondary and reflected electrons accelerated and focused by said magnetic lens,
3) a field aperture configured to determine a field of view of the secondary and reflected electrons whose divergent angle is determined by said aperture, and
4) a projection lens configured to form, at a predetermined scale of enlargement, the image defined by the secondary and reflected electrons whose field of view is determined by said field aperture; and c) an electron beam detection unit, on which the image is formed by said projection optical unit, configured to generate and to output a detection signal in accordance with the image.

4. An electron beam inspection apparatus comprising:

a) an electron beam irradiation unit configured to emit, from a linear cathode, an electron beam having a rectangular cross section, and to irradiate an inspection region of a sample with a single irradiation of the electron beam, wherein said electron beam irradiation unit forms the electron beam to have an area that is substantially the same as an area of the inspection region;

b) a projection optical unit configured to form, at a predetermined scale of enlargement, an image that is defined by secondary and reflected electrons emitted from the inspection region when irradiated with the electron beam, said projection optical unit including:
1) an electrostatic cathode lens configured to accelerate and focus the secondary and reflected electrons emitted from the inspection region, and including:
   i) a metal mesh, positioned near the sample, through which mesh the secondary and reflected electrons produced from the inspection region pass,
2) an aperture configured to determine a divergent angle of the secondary and reflected electrons accelerated and focused by said cathode lens,
3) a field aperture configured to determine a field of view of the secondary and reflected electrons whose divergent angle is determined by said aperture, and
4) a projection lens configured to form, at a predetermined scale of enlargement, the image defined by the secondary and reflected electrons whose field of view is determined by said field aperture; and c) an electron beam detection unit, on which the image is formed by said projection optical unit, configured to generate and to output a detection signal in accordance with the image.

5. An electron beam inspection apparatus comprising:

a) an electron beam irradiation unit configured to emit, from a linear cathode, an electron beam having a rectangular cross section, and to irradiate an inspection region of a sample with a single irradiation of the electron beam, wherein said electron beam irradiation unit forms the electron beam to have an area that is substantially the same as an area of the inspection region;

b) a projection optical unit configured to form, at a predetermined scale of enlargement, an image that is defined by secondary and reflected electrons emitted from the inspection region when irradiated with the electron beam, said projection optical unit including:
1) an electrostatic cathode lens, configured to accelerate and focus the secondary and reflected electrons emitted from the inspection region, and including:

i) first and second electrodes, connected to each other via a high-resistance material having a resistance of not less than $10^6$ Ω, through which first and second electrodes the secondary and reflected electrons produced from the inspection region pass, 2) an aperture configured to determine a divergent angle of the secondary and reflected electrons accelerated and focused by said cathode lens, 3) a field aperture configured to determine a field of view of the secondary and reflected electrons whose divergent angle is determined by said aperture, and 4) a projection lens configured to form, at a predetermined scale of enlargement, the image defined by the secondary and reflected electrons whose field of view is determined by said field aperture; and c) an electron beam detection unit, on which the image is formed by said projection optical unit, configured to generate and to output a detection signal in accordance with the image.

6. An electron beam inspection apparatus comprising:

a) an electron beam irradiation unit configured to emit, from a linear cathode, an electron beam having a rectangular cross section, and to irradiate an inspection region of a sample with a single irradiation of the electron beam, wherein said electron beam irradiation unit forms the electron beam to have an area that is substantially the same as an area of the inspection region;

b) a projection optical unit configured to form, at a predetermined scale of enlargement, an image that is defined by secondary and reflected electrons emitted from the inspection region when irradiated with the electron beam, said projection optical unit including:

1) an magnetic lens, configured to accelerate and focus the secondary and reflected electrons emitted from the inspection region, and including:

i) a metal mesh, positioned near the sample, through which mesh the secondary and reflected electrons produced from the inspection region pass, 2) an aperture configured to determine a divergent angle of the secondary and reflected electrons accelerated and focused by said magnetic lens, 3) a field aperture configured to determine a field of view of the secondary and reflected electrons whose divergent angle is determined by said aperture, and 4) a projection lens configured to form, at a predetermined scale of enlargement, the image defined by the secondary and reflected electrons whose field of view is determined by said field aperture; and c) an electron beam detection unit, on which the image is formed by said projection optical unit, configured to generate and to output a detection signal in accordance with the image.

* * * * *